(12) United States Patent
Kim et al.

(10) Patent No.: US 9,829,537 B2
(45) Date of Patent: Nov. 28, 2017

(54) STACK TYPE SEMICONDUCTOR APPARATUS AND SYSTEM INCLUDING THE STACK TYPE SEMICONDUCTOR APPARATUS

(71) Applicant: SK hynix Inc., Icheon-si, Gyeonggi-do (KR)

(72) Inventors: Ji Hwan Kim, Icheon-si (KR); Jong Chern Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 47 days.

(21) Appl. No.: 15/152,741

(22) Filed: May 12, 2016

(65) Prior Publication Data
US 2017/0227605 A1    Aug. 10, 2017

(30) Foreign Application Priority Data

Feb. 5, 2016  (KR) .................. 10-2016-0014917

(51) Int. Cl.
| | |
|---|---|
| *G11C 29/00* | (2006.01) |
| *G01R 31/317* | (2006.01) |
| *G01R 31/3177* | (2006.01) |
| *H01L 25/065* | (2006.01) |
| *H01L 27/112* | (2006.01) |

(52) U.S. Cl.
CPC ... *G01R 31/31723* (2013.01); *G01R 31/3177* (2013.01); *H01L 25/0657* (2013.01); *H01L 27/11206* (2013.01); *H01L 2225/06527* (2013.01); *H01L 2225/06544* (2013.01); *H01L 2225/06596* (2013.01)

(58) Field of Classification Search
None
See application file for complete search history.

(56) References Cited

U.S. PATENT DOCUMENTS

| | | | | |
|---|---|---|---|---|
| 7,409,669 | B1 * | 8/2008 | Dastidar | G01B 31/31851 716/117 |
| 2004/0257090 | A1 * | 12/2004 | Barr | G01R 31/046 324/537 |
| 2010/0060310 | A1 * | 3/2010 | Laisne | H01L 25/0657 326/10 |
| 2014/0192583 | A1 * | 7/2014 | Rajan | G11C 7/10 365/63 |
| 2014/0245105 | A1 * | 8/2014 | Chung | G06F 11/1048 714/763 |

FOREIGN PATENT DOCUMENTS

KR    1020160039452 A    4/2016

* cited by examiner

*Primary Examiner* — M. Mujtaba Chaudry
(74) *Attorney, Agent, or Firm* — William Park & Associates Ltd.

(57) ABSTRACT

A stack type semiconductor apparatus may be provided. The stack type semiconductor apparatus may include a plurality of semiconductor chips stacked and configured for transferring signals through through-hole vias. Each of the plurality of stacked semiconductor chips may include an error detection circuit configured to perform a down scan for transferring a signal to a lower direction and an up scan for transferring a signal to an upper direction through through-hole vias in a column direction among the through-hole vias, and to determine whether the through-hole vias have failed according to a down scan result value and an up scan result value.

27 Claims, 13 Drawing Sheets

STACK TYPE SEMICONDUCTOR APPARATUS AND SYSTEM INCLUDING THE STACK TYPE SEMICONDUCTOR APPARATUS

CROSS-REFERENCES TO RELATED APPLICATION

This application claims priority under 35 U.S.C. 119(a) to Korean application No. 10-2016-0014917, filed on Feb. 5, 2016, in the Korean intellectual property Office, which is incorporated by reference in its entirety as set forth in full.

BACKGROUND

1. Technical Field

Various embodiments generally relate to a semiconductor integrated circuit and/or system, and more particularly, to a stack type semiconductor apparatus.

2. Related Art

The stack type semiconductor apparatuses may be configured to transfer signals of staked semiconductor chips using through-hole vias.

When the failure of the through-hole via occurs, normal signal transfer may be difficult. Therefore, the repair operation for accurately detecting the failed through-hole via and replacing the failed through-hole via with a normal through-hole via may be necessary.

SUMMARY

According to an embodiment, there may be provided a stack type semiconductor apparatus. The stack type semiconductor apparatus may include a plurality of semiconductor chips stacked and configured for transferring signals through through-hole vias. Each of the plurality of stacked semiconductor chips may include an error detection circuit configured to perform a down scan for transferring a signal to a lower direction and an up scan for transferring a signal to an upper direction through through-hole vias in a column direction among the through-hole vias, and to determine whether the through-hole vias have failed according to a down scan result value and an up scan result value.

According to an embodiment, there may be provided a stack type semiconductor apparatus. The stack type semiconductor apparatus may include a plurality of semiconductor chips stacked and configured for transferring signals through through-hole vias. Each of the plurality of stacked semiconductor chips may include an error detection circuit configured to perform a down scan by allowing current to flow through a through-hole via of a lowermost semiconductor chip among the plurality of semiconductor chips through a through-hole via of an uppermost semiconductor chip, to perform an up scan by allowing current to flow through the through-hole via of the uppermost semiconductor chip from the through-hole via of the lowermost semiconductor chip, and to determine whether the through-hole vias have failed according to a down scan result value and an up scan result value. The stack type semiconductor apparatus may include a repair circuit configured to switch an input and output (input/output) (I/O) path coupled to a through-hole via determined to be a failure through the error detection circuit to an I/O path coupled to a normal through-hole via.

According to an embodiment, there may be provided a stack type semiconductor apparatus. The stack type semiconductor apparatus may include a plurality of semiconductor chips stacked and configured for transferring signals through through-hole vias. Each of the plurality of stacked semiconductor chips may include an error detection circuit configured to initialize a pre-stored down scan result value according to a first preset signal and perform a down scan for transferring a signal to a lower direction through through-hole vias in a column direction among the through-hole vias, to initialize a pre-stored up scan result value according to a second preset signal and perform an up scan for transferring a signal to an upper direction through the through-hole vias in the column direction, and to determine whether the through-hole vias have failed according to the down scan result value and the up scan result value.

DETAILED DESCRIPTION

Figure 1:
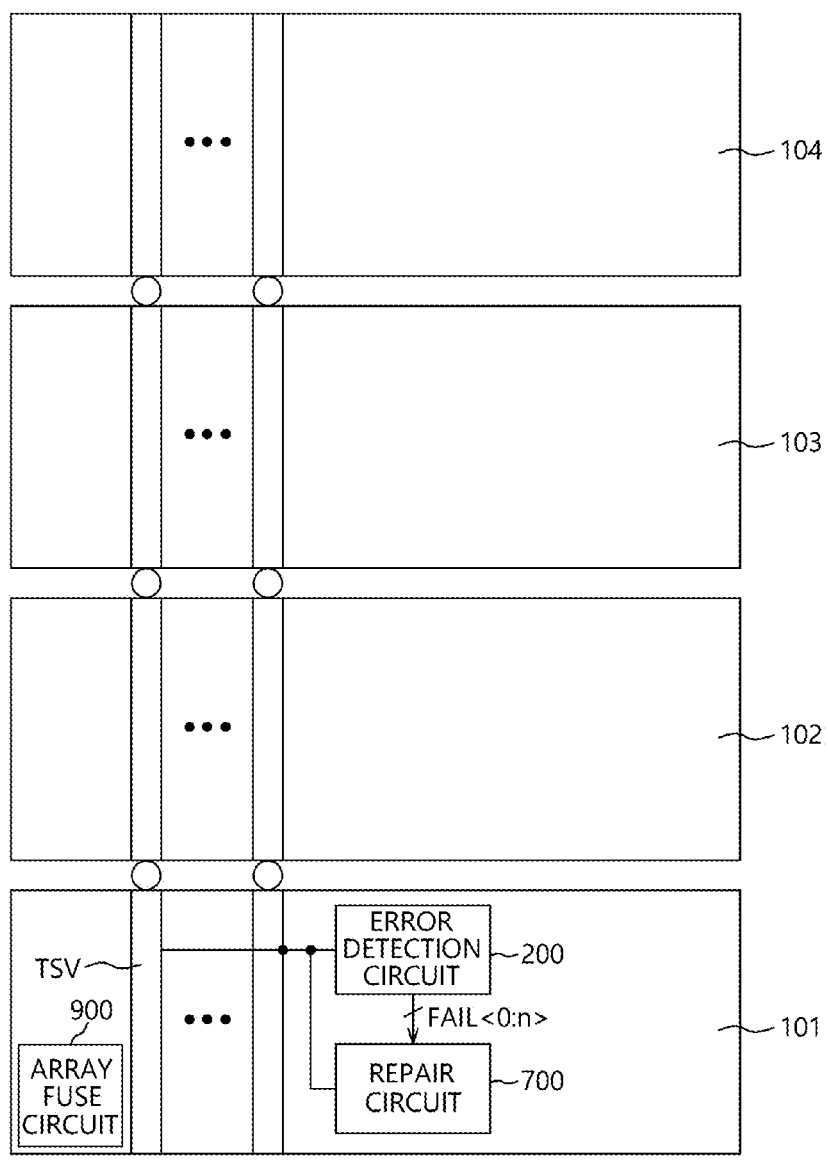
FIG. 1 is a view illustrating a representation of an example of a configuration of a semiconductor apparatus according to an embodiment.

One or more examples of embodiments may be provided regarding a stack type semiconductor apparatus capable of improving accuracy for failure detection of a through-hole via and a repair operation according to the failure detection, and reducing a time required for the failure detection and the repair operation.

Hereinafter, examples of embodiments will be described below with reference to the accompanying drawings. Examples of the embodiments are described herein with reference to cross-sectional illustrations that are schematic illustrations of examples of the embodiments (and intermediate structures). As such, variations from the shapes of the illustrations as a result, for example, of manufacturing techniques and/or tolerances, are to be expected. Thus, examples of the embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The concepts are described herein with reference to cross-section and/or plan illustrations that are schematic illustrations of idealized embodiments. However, the embodiments should not be limited. Although a few embodiments will be illustrated and described, it will be appreciated by those of ordinary skill in the art that changes may be made in these examples of embodiments without departing from the principles and spirit of the description.

Referring to FIG. 1, a semiconductor apparatus 100 according to an embodiment may include a plurality of stacked semiconductor chips 101 to 104.

The plurality of stacked semiconductor chips 101 to 104 may perform signal transfer through through-hole vias, for example, through silicon vias TSV.

The stacked semiconductor chips 101 to 104 may include memory regions for information storage and may have the same configuration as each other.

Each of the stacked semiconductor chips 101 to 104 may include an error detection circuit 200 and a repair circuit 700.

The error detection circuit 200 may generate failure determination signals FAIL<0:n> by detecting a failure of through-hole vias of a corresponding semiconductor chip.

The error detection circuit 200 may perform a down scan for transferring a signal to a lower direction and an up scan for transferring a signal to an upper direction on through-hole vias in a column direction among the through-hole vias TSV, and generate the failure determination signals FAIL<0:n> by determining whether or not the through-hole vias are failed according to a down scan result value and an up scan result value.

The failure of the through-hole via TSV may refer to a state in which signal transfer performance of the through-hole vias is equal to or less than a reference value or a state in which signal transfer of the through-hole via is impossible.

The repair circuit 700 may replace a through-hole via determined as a failure with a normal through-hole via according to the failure determination signals FAIL<0:n>.

The through-hole vias TSV may include spare through-hole vias.

Each of the stacked semiconductor chips 101 to 104 may further include an array fuse circuit 900.

The array fuse circuit 900 may include an array fuse, a logic circuit, and the like configured to input and output information related to a column/row repair operation of a failed memory cell among memory cells in the memory region included in the semiconductor chip.

An operation which inputs, outputs, or inputs/outputs the information related to the column/row repair operation of the failed memory cell in the array fuse circuit 900 may refer to a boot-up operation. In an embodiment, the error detection circuit 200 may use a signal used in the boot-up operation of the array fuse circuit 900 as the source signal COUT0.

Figure 2:
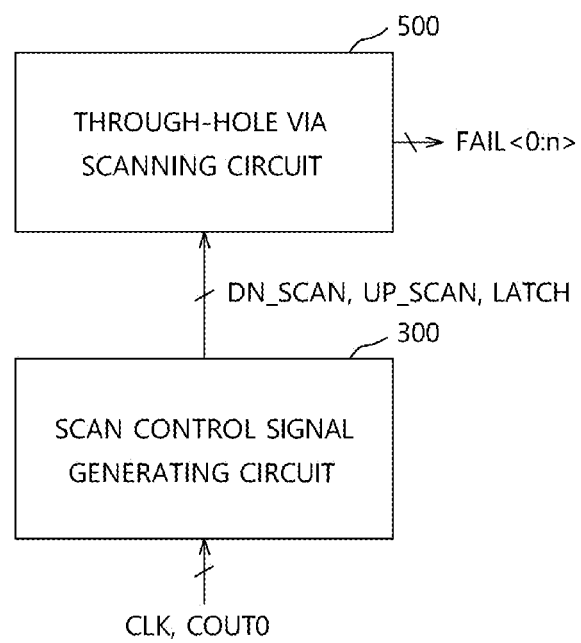
FIG. 2 is a view illustrating a representation of an example of a configuration of an error detection circuit of FIG. 1.

Referring to FIG. 2, the error detection circuit 200 may include a scan control signal generating circuit 300 and a through-hole via scanning circuit 500.

The scan control signal generating circuit 300 may generate scan control signals, that is, an up scan signal UP_SCAN, a down scan signal DN_SCAN, and a latch signal LATCH according to a clock signal CLK and a source signal COUT0.

The clock signal CLK and the source signal COUT0 may be signals which are to be used in the boot-up operation of the array fuse circuit 900 of FIG. 1 and may be used in the scan control signal generating circuit 500.

The through-hole via scanning circuit 500 may generate a plurality of failure determination signals FAIL<0:n> which define a failure/non-failure of the through-hole vias TSV by performing a scan on the through-hole vias TSV according to the up scan signal UP_SCAN, the down scan signal DN_SCAN, and the latch signal LATCH.

The plurality of failure determination signals FAIL<0:n> may define a failure/non-failure of all the through-hole vias TSV, and an example in which the number of through-hole vias TSV is n+1 may be described for example.

First, the through-hole via scanning circuit 500 may generate the plurality of failure determination signals FAIL<0:n> by performing the up scan and down scan for transferring the same signal on the through-hole vias TSV in the column direction among the through-hole vias TSV.

Figure 3:
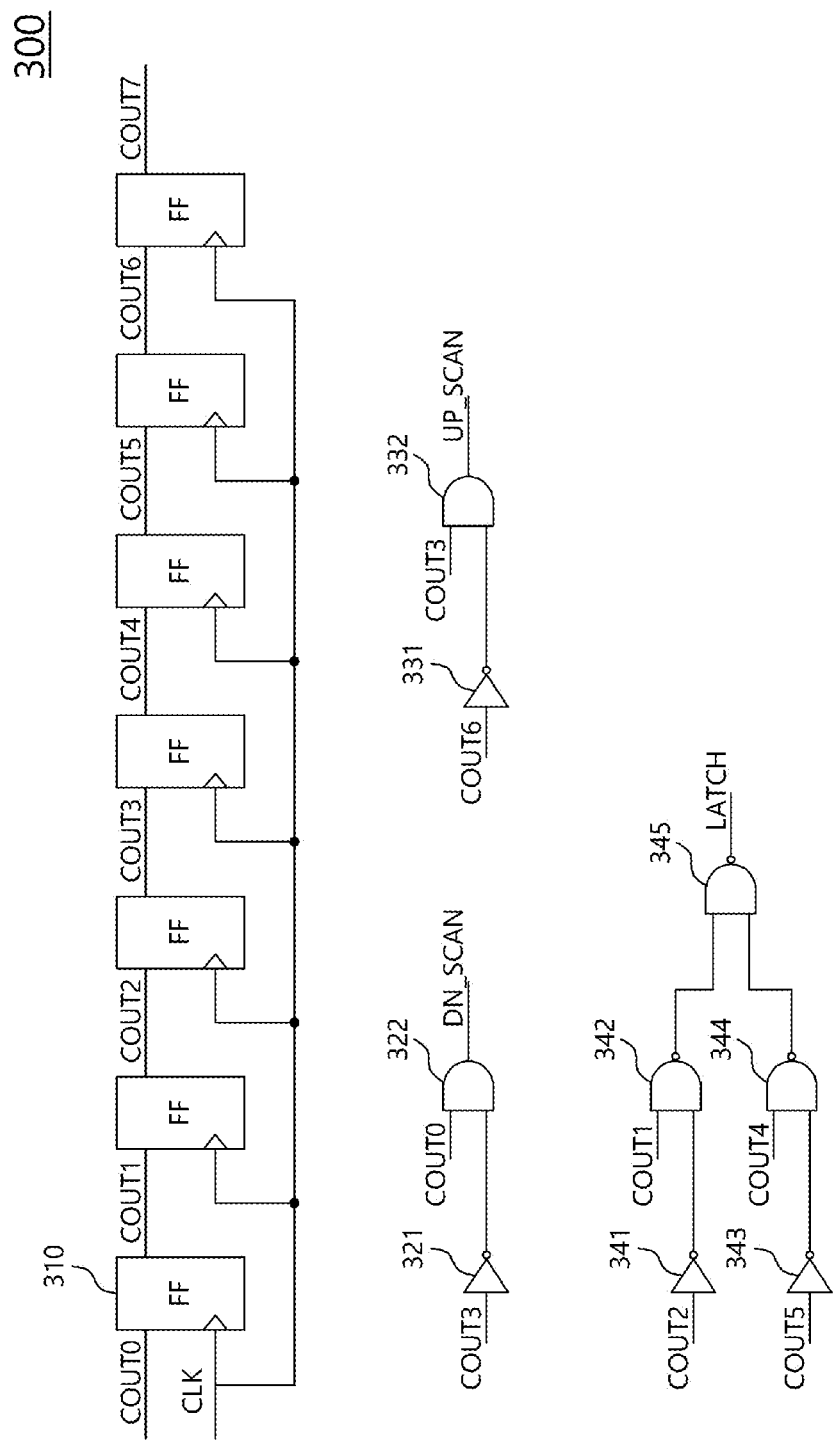
FIG. 3 is a view illustrating a representation of an example of a configuration of a scan control signal generating circuit of FIG. 2.
Figure 4:
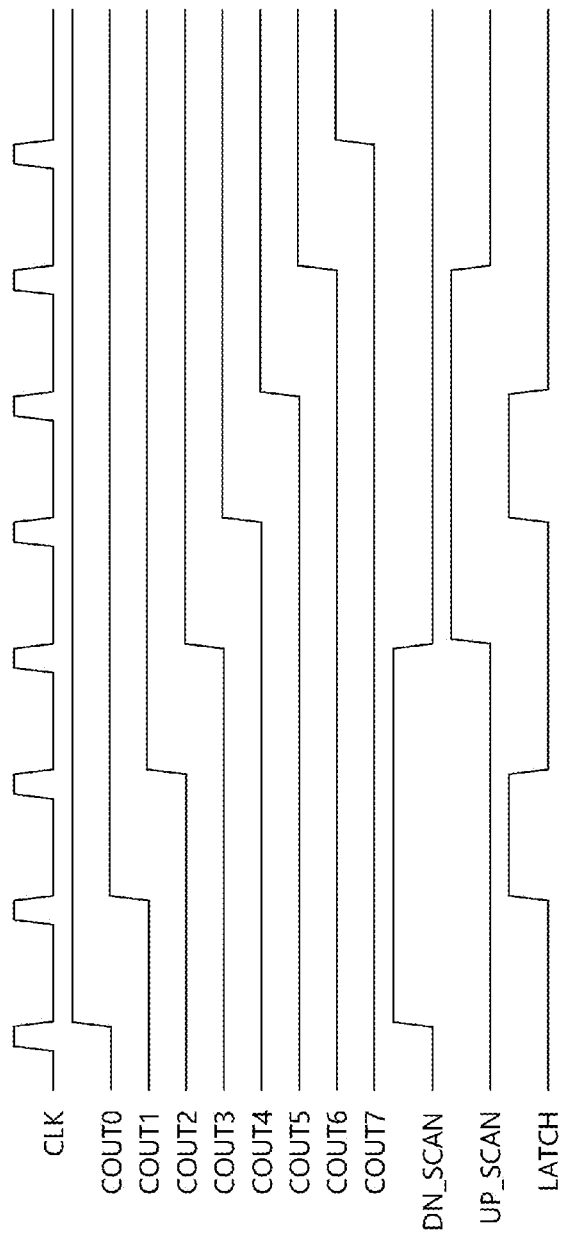
FIG. 4 is a timing diagram illustrating a representation of an example of an operation of the scan control signal generating circuit of FIG. 3.

Referring to FIGS. 3 and 4, the scan control signal generating circuit 300 may include a plurality of flip flops FF (i.e., 310) and first to ninth logic gates 321, 322, 331, 332, and 341 to 345.

The plurality of flip flops 310 may generate a plurality of shift signals COUT1 to COUT7 by sequentially shifting the source signal COUT0 according to the clock signal CLK.

The first logic gate 321 may invert the shift signal COUT3 among the plurality of shift signals COUT1 to COUT7 and output an inverting result.

The second logic gate 322 may perform an AND operation on the source signal COUT0 and an output signal of the first logic gate 321 and output an AND operation result as the down scan signal DN_SCAN.

The third logic gate 331 may invert the shift signal COUT6 among the plurality of shift signals COUT1 to COUT7 and output an inverting result.

The fourth logic gate 332 may perform an AND operation on the shift signal COUT3 among the plurality of shift signals COUT1 to COUT7 and an output signal of the third logic gate 331 and output an AND operation result as the up scan signal UP_SCAN.

The fifth logic gate 341 may invert the shift signal COUT2 among the plurality of shift signals COUT1 to COUT7 and output an inverting result.

The sixth logic gate 342 may perform an NAND operation on the shift signal COUT1 among the plurality of shift signals COUT1 to COUT7 and an output signal of the fifth logic gate 341 and output a NAND operation result.

The seventh logic gate 343 may invert the shift signal COUT5 among the plurality of shift signals COUT1 to COUT7 and output an inverting result.

The eighth logic gate 344 may perform an NAND operation on the shift signal COUT4 among the plurality of shift signals COUT1 to COUT7 and an output signal of the seventh logic gate 343 and output an NAND operation result.

The ninth logic gate 345 may perform an NAND operation on an output signal of the sixth logic gate 342 and an output signal of the eighth logic gate 344 and output an NAND operation result as the latch signal LATCH.

Referring to FIG. 4, the down scan signal DN_SCAN may be activated during a periodf from a rising edge of the source signal COUT0 to a rising edge of the shift signal COUT3, and then the up scan signal UP_SCAN may be activated during a period from the rising edge of the shift signal COUT3 to a rising edge of the shift signal COUT6.

The latch signal LATCH may be activated once in the activation period of the down scan signal DN_SCAN and once in the activation period of the up scan signal UP_SCAN.

Figure 5:
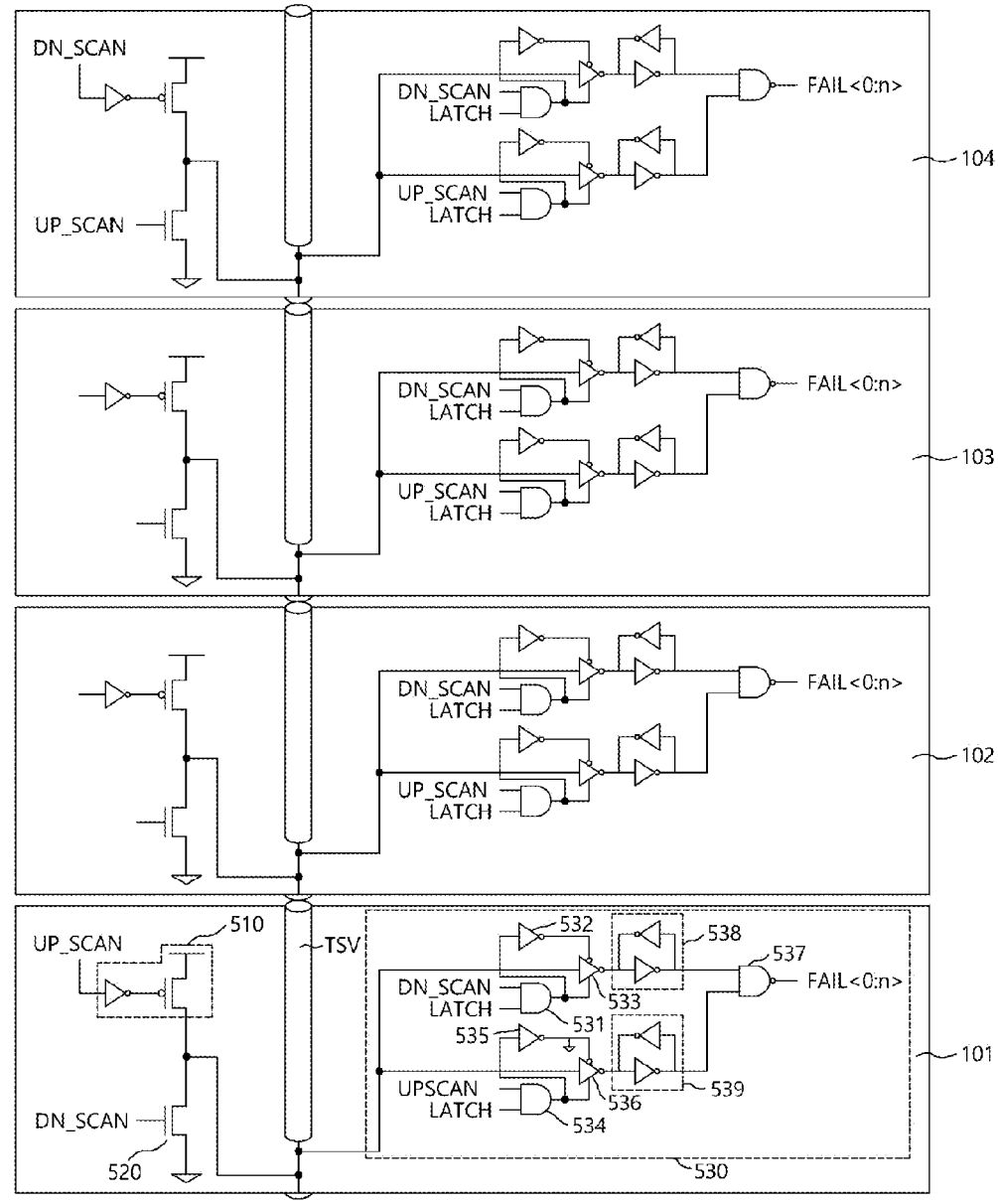
FIG. 5 is a view illustrating a representation of an example of a configuration of a through-hole via scanning circuit of FIG. 2.

Referring to FIG. 5, the through-hole via scanning circuit 500 may be included in each of the stacked semiconductor chips 101 to 104. FIG. 5 illustrates an example of the through-hole via scanning circuits 500 corresponding to through-hole vias which are included in the stacked semiconductor chips 101 to 104 one by one and arranged on the same line in the column direction among the through-hole vias TSV of the stacked semiconductor chips 101 to 104.

The through-hole via scanning circuit 500 may include a current source 510, a current leaker 520, and a failure determination circuit 530.

The current source 510 may allow current to flow to the through-hole via TSV from a power terminal according to the up scan signal UP_SCAN or the down scan signal DOWN_SCAN, and may include an inverter and a PMOS transistor.

The current leaker 520 may allow current to flow to a ground terminal from the through-hole via TSV according to the up scan signal UP_SCAN or down scan signal DN_SCAN, and may include an NMOS transistor.

The failure determination circuit 530 may generate the plurality of failure determination signals FAIL<0:n> based on voltage levels of the through-hole vias TSV according to the up scan signal UP_SCAN and the down scan signal DN_SCAN.

The failure determination circuit 530 may include first to seventh logic gates 531 to 537 and first and second latches 538 and 539.

The first logic gate 531 may perform an AND operation on the down scan signal DN_SCAN and the latch signal LATCH and output an AND operation result.

The second logic gate 532 may invert an output signal of the first logic gate 531 and output an inverting result.

The third logic gate 533 may receive the output signal of the first logic gate 531 through a non-inverting control terminal and receive an output signal of the second logic gate 532 through an inverting control terminal.

The third logic gate 533 may transmit an input signal only when a level of the non-inverting control terminal is logic high and a level of the inverting control terminal is logic low.

The first latch 538 may latch an output signal of the third logic gate 533.

The fourth logic gate 534 may perform an AND operation on the up scan signal UP_SCAN and the latch signal LATCH and output an AND operation result.

The fifth logic gate 535 may invert an output signal of the fourth logic gate 534 and output an inverting result.

The sixth logic gate 536 may receive the output signal of the fourth logic gate 534 through a non-inverting control terminal and receive an output signal of the fifth logic gate 535 through an inverting control terminal.

The sixth logic gate 536 may transmit an input signal only when a level of the non-inverting control terminal is logic high and a level of the inverting control terminal is logic low.

The second latch 539 may latch an output signal of the sixth logic gate 536.

The seventh logic gate 537 may perform an NAND operation on a signal latched in the first latch 538 and a signal latched in the second latch 539 and output an NAND operation result as one of the plurality of failure determination signals FAIL<0:n> corresponding to corresponding one among the through-hole vias of the semiconductor chip.

The down scan signal DN_SCAN may be input to the current source 510 of the uppermost semiconductor chip 104 among the stacked semiconductor chips 101 to 104 and the up scan signal UP_SCAN may be input to the current leaker 520 of the uppermost semiconductor chip 104.

The up scan signal UP_SCAN may be input to the current source 510 of the lowermost semiconductor chip 101 among the stacked semiconductor chips 101 to 104 and the down scan signal DN_SCAN may be input to the current leaker 520 of the lowermost semiconductor chip 101.

Input terminals of the current sources 510 and the current leakers 520 of other semiconductor chips 102 and 103 other than the uppermost semiconductor chip 104 and the lowermost semiconductor chip 101, that is, input terminals of the inverters and gates of the NMOS transistors in the other semiconductor chips 102 and 103 may be floating.

Stacking information according to the stacking of the semiconductor chips 101 to 104 may be stored in each of the stacked semiconductor chips 101 to 104.

The stacking information may be information which defines a staked position of a corresponding semiconductor chip, that is, an uppermost position, a lowermost position, or a middle position.

According to the stack type semiconductor apparatus according to an embodiment, the through-hole via scanning circuit 500 may selectively input the down scan signal DN_SCAN and the up scan signal UP_SCAN to the current source 510 and the current leaker 520 or allow the current source 510 and the current leaker 520 to be floating, according to the stacked position of a corresponding semiconductor chip among the stacked semiconductor chips using the stacking information as illustrated in FIG. 5.

The through-hole via failure detection operation according to an embodiment will be described with reference to FIGS. 4 and 5.

First, as the down scan signal DN_SCAN is activated, current may flow from the current source 510 of the uppermost semiconductor chip 104 to the current leaker 520 of the lowermost semiconductor chip 101 through the through-hole vias TSV.

Since the up scan signal UP_SCAN is inactivated during the activation period of the down scan signal DN_SCAN, the current leaker 520 of the uppermost semiconductor chip 104 and the current source 510 of the lowermost semiconductor chip 101 may be inactivated.

As the latch signal LATCH is activated in a state that the down scan signal DN_SCAN is activated, the failure determination circuit 530 in each of the stacked semiconductor chips 101 to 104 may store a voltage level according to the current flowing through the through-hole via TSV coupled to the corresponding failure determination circuit 530 as the down scan result value.

Subsequently, as the up scan signal UP_SCAN is activated, current may flow from the current source 510 of the lowermost semiconductor chip 101 to the current leaker 520 of the uppermost semiconductor chip 104 through the through-hole vias TSV.

Since the down scan signal DN_SCAN is inactivated during the activation period of the up scan signal UP_SCAN, the current leaker 520 of the lowermost semiconductor chip 101 and the current source 510 of the uppermost semiconductor chip 104 may be inactivated.

As the latch signal LATCH is activated in a state that the up scan signal UP_SCAN is activated, the failure determination circuit 530 in each of the stacked semiconductor chips 101 to 104 may store a voltage level according to the current flowing through the through-hole via TSV coupled to the corresponding failure determination circuit 530 as the up scan result value.

The failure determination circuit 530 in each of the stacked semiconductor chips 101 to 104 may inactivate corresponding one of the failure determination signals FAIL<0:n> to a low level when both the stored down scan result value and the stored up scan result value have a value (for example, a high level) which defines a normal state of the corresponding through-hole via TSV.

The failure determination circuit 530 may activate the corresponding one of the failure determination signals FAIL<0:n> to a high level when any one of the stored down scan result value and the stored up scan result value has a value (for example, a low level) which defines a failure of the corresponding through-hole via TSV.

Figure 6:
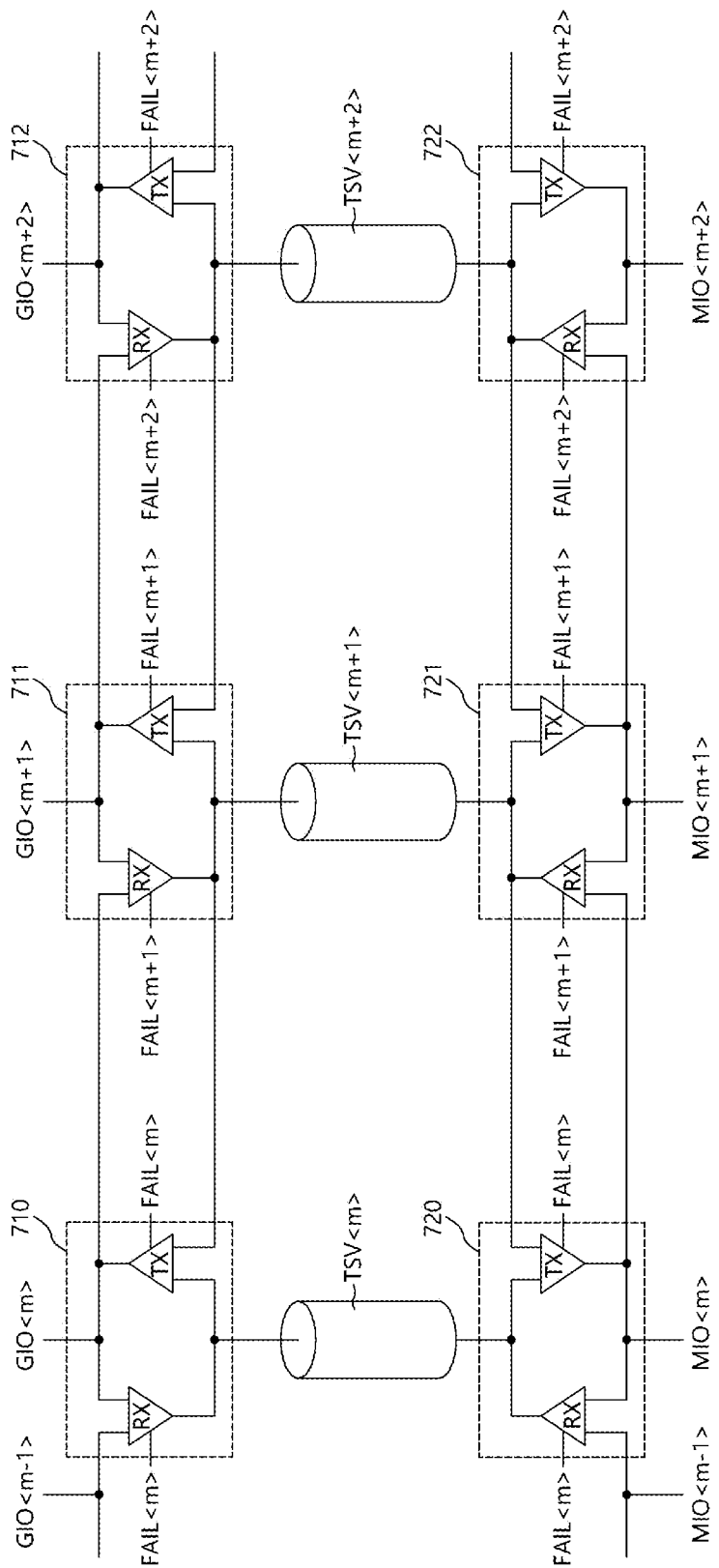
FIG. 6 is a view illustrating a representation of an example of a configuration of a repair circuit of FIG. 1.

FIG. 6 illustrates the repair circuit 700 for partial through-hole vias TSV<m:m+2> among the through-hole vias TSV.

Referring to FIG. 6, the repair circuit 700 may include first I/O drivers 710 to 712 and second I/O drivers 720 to 722 coupled to the through-hole vias TSV<m:m+2>.

The first I/O drivers 710 to 712 may have the same configuration as each other, and the second I/O drivers 720 to 722 may have the same configuration as each other.

The first I/O drivers 710 to 712 and the second I/O drivers 720 to 722 may be configured to switch an I/O path coupled to a failed through-hole via TSV to an I/O path coupled to a normal through-hole via TSV according to the failure determination signals FAIL<m:m+2>.

The first I/O driver 710 may be coupled between first signal I/O lines GIO<m−1> and GIO<m> among first signal I/O lines GIO<m−1:m+2> and through-hole vias TSV<m> and TSV<m+1> among the through-hole vias TSV<m:m+2>.

The first I/O driver 710 may include an input driver RX and an output driver TX.

The input driver RX of the first I/O driver 710 may drive a signal transferred through the first signal I/O line GIO<m> or a previous first signal I/O line GIO<m−1> to the through-hole via TSVm according to a failure determination signal FAIL<m>.

The output driver TX of the first I/O driver 710 may drive a signal transferred through the through-hole via TSV<m> or next through-hole via TSV<m+1> to the first signal I/O line GIO<m> according to the failure determination signal FAIL<m>.

The second I/O driver 720 may be coupled between through-hole vias TSV<m> and TSV<m+1> among the through-hole vias TSV<m:m+2> and second signal I/O lines MIO<m−1> and MIO<m> among the second signal I/O lines MIO<m−1:m+2>.

The second I/O driver 720 may include an input driver RX and an output driver TX.

The input driver RX of the second I/O driver 720 may drive a signal transferred through the second signal I/O line MIO<m> or a previous second signal I/O line MIO<m−1> to the through-hole via TSV<m> according to the failure determination signal FAIL<m>.

The output driver TX of the second I/O driver 720 may drive a signal transferred through the through-hole via TSV<m> or next through-hole via TSV<m+1> to the second signal I/O line MIO<m> according to the failure determination signal FAIL<m>.

A repair operation for the through-hole via TSV according to an embodiment will be described with reference to FIG. 7.

For example, the repair operation when the through-hole via TSV<m+1> among the through-hole vias TSV is failed will be described.

Since the through-hole via TSV<m+1> is failed, the failure determination signal FAIL<m+1> among the failure determination signals FAIL<m:m+2> may have been activated through the through-hole via failure detection operation which has been already described with reference to FIGS. 4 and 5, and next failure determination signals including the failure determination signal FAIL<m+2> may also be activated.

Figure 7:
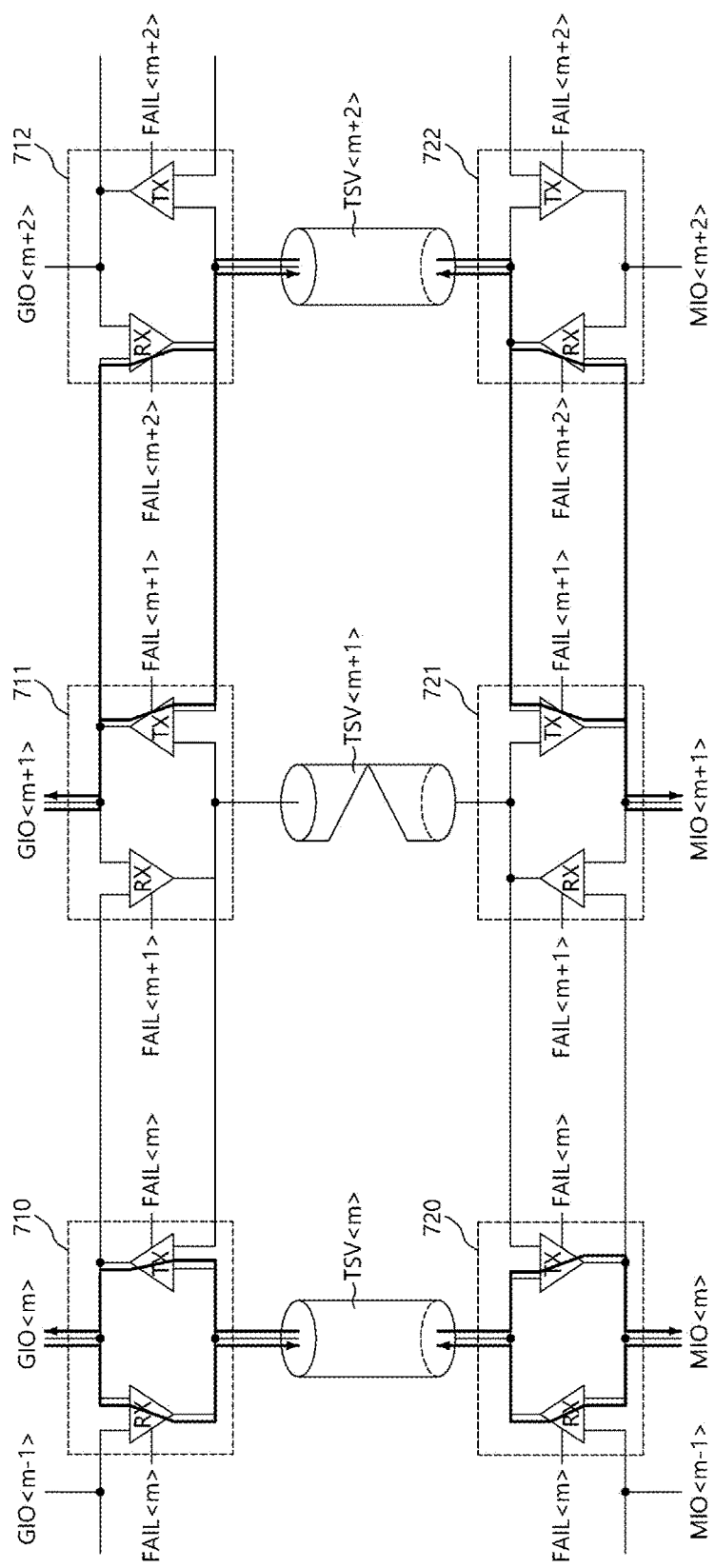
FIG. 7 is a view illustrating a representation of an example of a through-hole via repair operation according to an embodiment.

The repair operation for the through-hole via TSV according to an embodiment may be performed through a method which shifts the I/O path coupled to the failed through-hole via TSV, that is, a method which couples the I/O path coupled to the failed through-hole via TSV to the right normal through-hole via TSV on the basis of FIG. 7.

When the failure determination signal FAIL<m+1> is activated, failure determination signals including the failure determination signal FAIL<m+2> next to the failure determination signal FAIL<m+1> may also be activated.

Since the failure determination signal FAIL<m> is in an inactivation state, signal I/O between the first signal I/O line GIO<m> and the second signal I/O line MIO<m> may be performed through the through-hole via TSV<m> by the first I/O driver 710 and the second I/O driver 720.

Since the failure determination signal FAIL<m+1> is in an activation state, signal I/O between the first signal I/O line GIO<m+1> and the second signal I/O line MIO<m+1> may be performed through the through-hole via TSV<m+2> by the first I/O drivers 711 and 712 and the second I/O drivers 721 and 722.

As described above, the repair operation may be accomplished by shifting the signal I/O path between the first signal I/O lines GIO and the second signal I/O lines MIO to the right through-hole via TSV<m+2> by one on the basis of the failed through-hole via TSV<m+1>.

Figure 8:
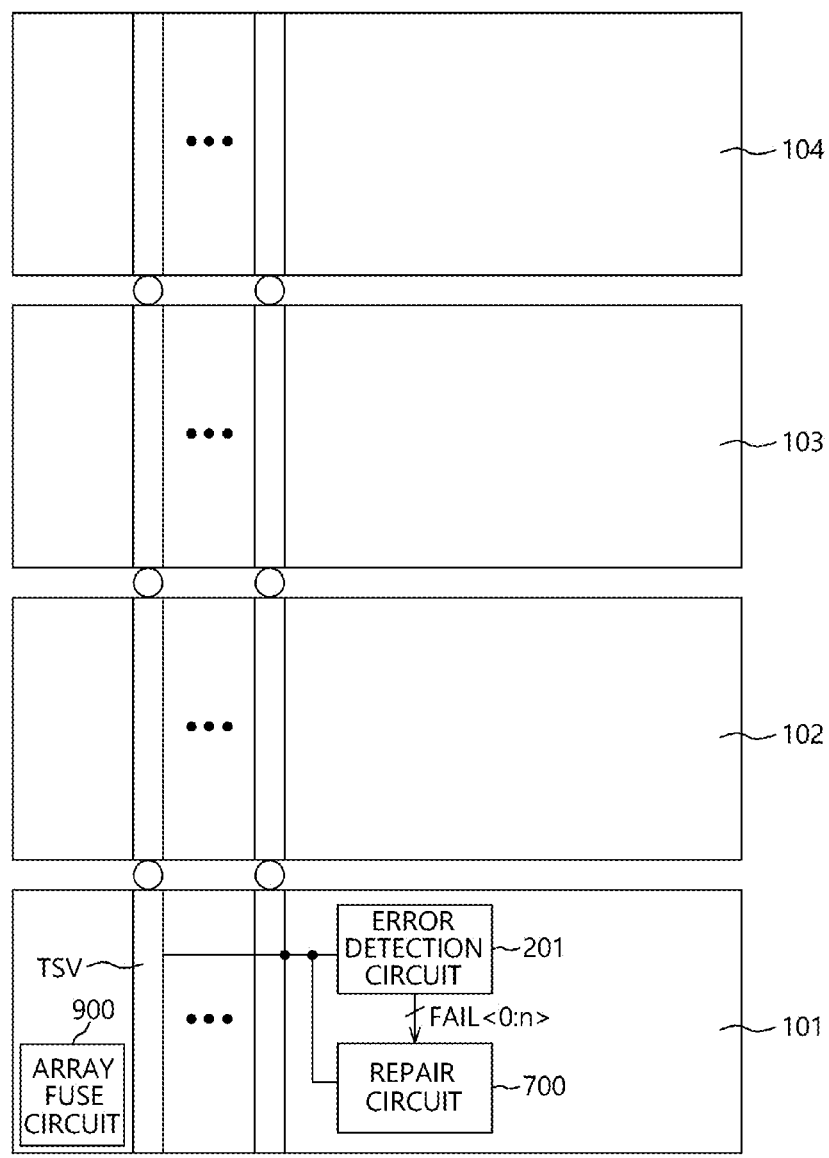
FIG. 8 is a view illustrating a representation of an example of a configuration of a semiconductor apparatus according to an embodiment.

Referring to FIG. 8, a semiconductor apparatus 1000 according to an embodiment may include a plurality of stacked semiconductor chips 101 to 104.

Each of the stacked semiconductor chips 101 to 104 may include an error detection circuit 201 and a repair circuit 700.

The error detection circuit 201 may generate failure determination signals FAIL<0:n> by detecting a failure of through-hole vias TSV of a corresponding semiconductor chip.

The error detection circuit 201 may initialize a pre-stored down scan result value and perform down scan for transferring a signal to a lower direction on through-hole vias in a column direction among the through-hole vias TSV, may initialize a pre-stored up scan result value and perform up scan for transferring a signal to an upper direction on the through-hole vias in the column direction, and may generate the failure determination signals FAIL<0:n> by determining whether or not the through-hole vias TSV are failed according to a down scan result value and an up scan result value.

The repair circuit 700 may replace a through-hole via determined as a failure according to the failure determination signals FAIL<0:n> with a normal through-hole via.

The configuration and operation of the repair circuit 700 may be the same as those of the repair circuit 700 of FIG. 1 described with reference to FIGS. 6 and 7, and thus a detailed description thereof will be omitted.

Each of the stacked semiconductor chips 101 to 104 may further include an array fuse circuit 900.

The array fuse circuit 900 may include an array fuse, a logic circuit, and the like configured to input and output information related to a column/row repair operation of a failed memory cell among memory cells in a memory region included in the semiconductor chip.

Figure 9:
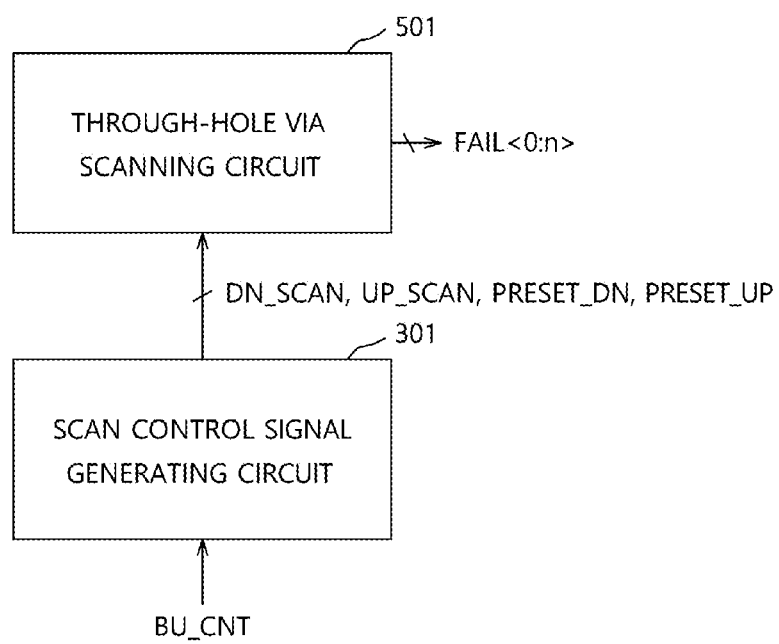
FIG. 9 is a view illustrating a representation of an example of a configuration of an error detection circuit of FIG. 8.

Referring to FIG. 9, the error detection circuit 201 may include a scan control signal generating circuit 301 and a through-hole via scanning circuit 501.

The scan control signal generating circuit 301 may generate scan control signals, that is, a first preset signal PRESET_DN, a down scan signal DN_SCAN, a second preset signal PRESET_UP, and an up scan signal UP_SCAN according to a boot-up count signal BU_CNT.

The boot-up count signal BU_CNT may be a signal used in a boot-up operation of the array fuse circuit 900 of FIG. 8.

The through-hole via scanning circuit 501 may perform initialization for a pre-stored down scale result value, initialization for a pre-stored up scan result value, down scan, and up scan according to the first preset signal PRESET_DN, the down scan signal DN_SCAN, the second preset signal PRESET_UP, and the up scan signal UP_SCAN and generate a plurality of failure determination signals FAIL<0:n> which define a failure/non-failure of the through-hole vias according to the down scan result value and the up scan result value.

The plurality of failure determination signals FAIL<0:n> may define the failure/non-failure of all the through-hole vias TSV, and an example in which the number of through-hole vias TSV is n+1 may be described for example.

First, the through-hole via scanning circuit 501 may generate the plurality of failure determination signals FAIL<0:n> by performing the up scan and down scan for transferring the same signal on through-hole vias TSV in the column direction among the through-hole vias TSV.

Figure 10:
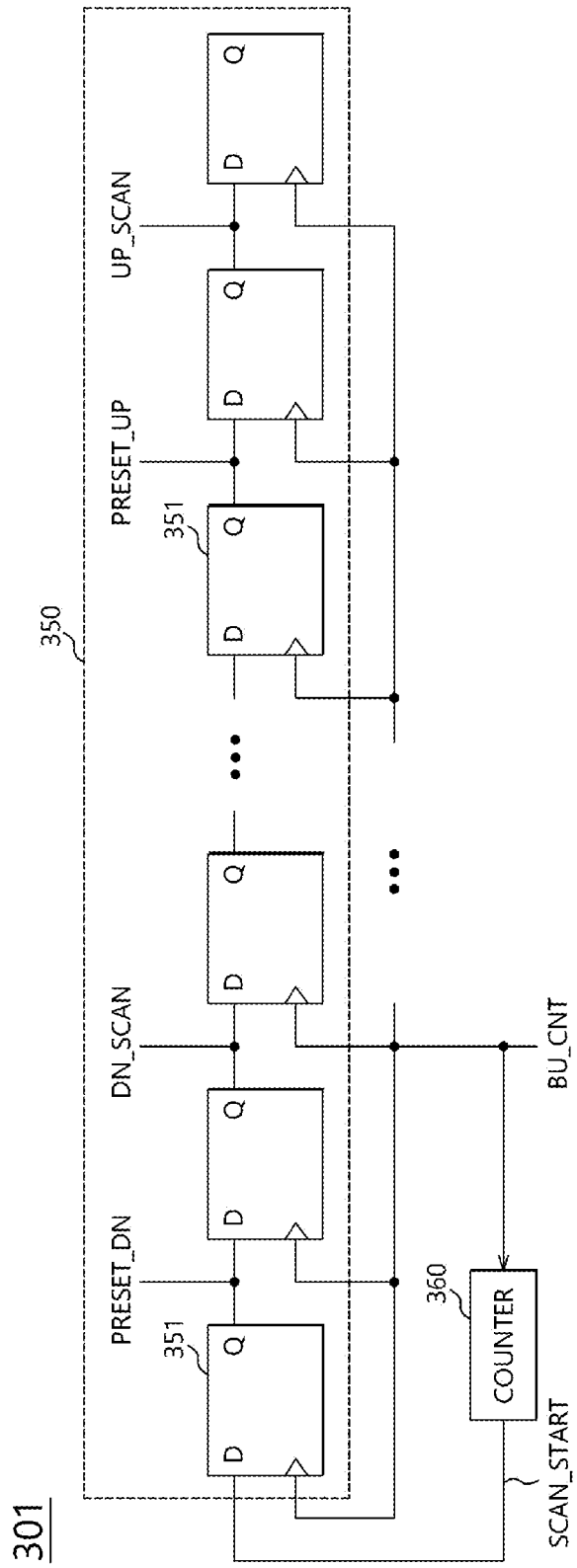
FIG. 10 is a view illustrating a representation of an example of a configuration of a scan control signal generating circuit of FIG. 9.

Referring to FIG. 10, the scan control signal generating circuit 301 may include a flip-flop array 350 and a counter 360.

Flip-flops 351 of the flip-flop array 350 may generate the scan control signals, that is, the first preset signal PRESET_DN, the down scan signal DN_SCAN, the second preset signal PRESET_UP, and the up scan signal UP_SCAN by sequentially shifting a scan start signal SCAN_START according to the boot-up count signal BU_CNT.

The counter 360 may activate the scan start signal SCAN_START at a preset timing by counting the boot-up count signal BU_CNT.

Figure 11:
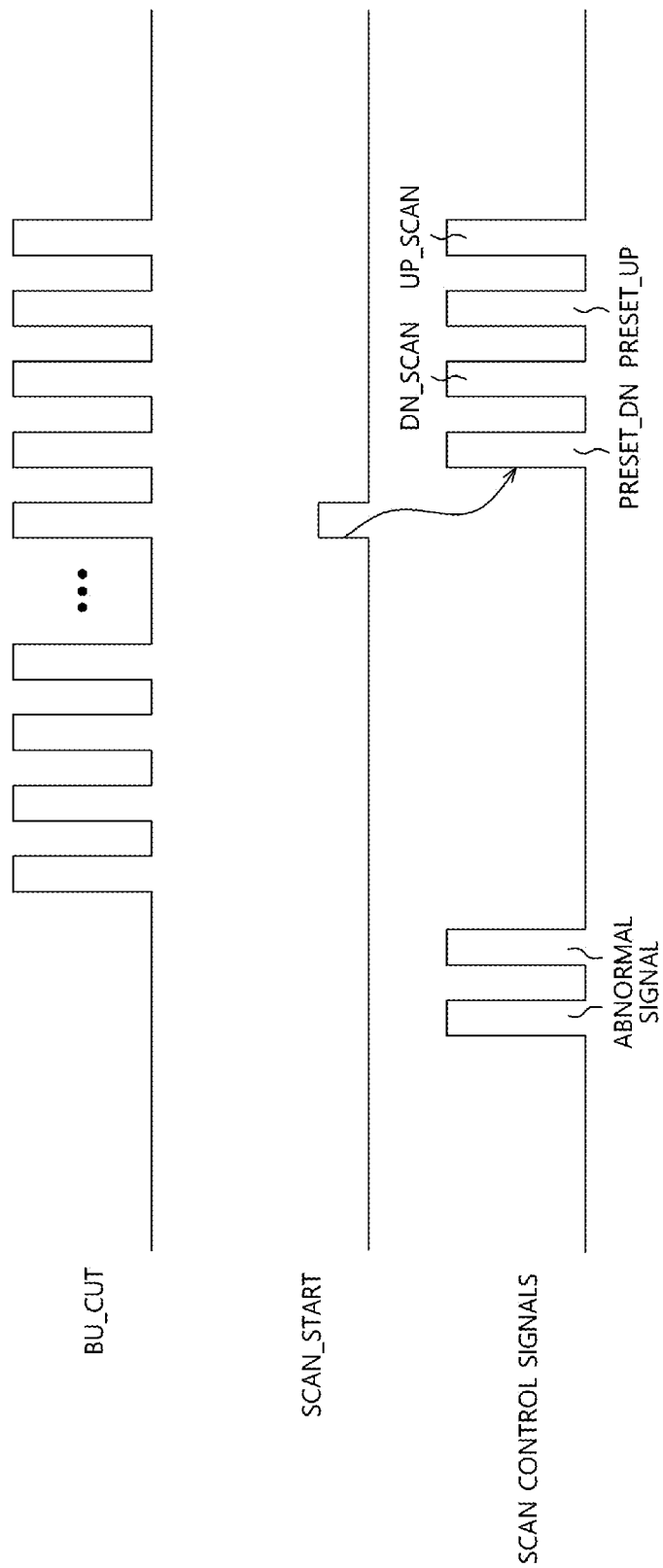
FIG. 11 is a timing diagram illustrating a representation of an example of an operation of the scan control signal generating circuit of FIG. 10.

Referring to FIG. 11, the first preset signal PRESET_DN may be activated in response to next boot-up count signal BU_CNT immediately after the scan start signal SCAN_START is activated, and the down scan signal DN_SCAN, the second preset signal PRESET_UP, and the up scan signal UP_SCAN may be sequentially activated at fixed intervals on the basis of a pulse of the boot-up count signal BU_CNT.

The timing diagram of FIG. 11 is exemplified only on the basis of the circuit configuration of the through-hole via scanning circuit 301 of FIG. 10, and the first preset signal PRESET_DN, the down scan signal DN_SCAN, the second preset signal PRESET_UP, and the up scan signal UP_SCAN may be activated at a desired timing and at desired intervals by adjusting an inner setup value of the counter 360 or by adjusting flip-flops 351 for withdrawal of output signals among the flip flops 351.

Figure 12:
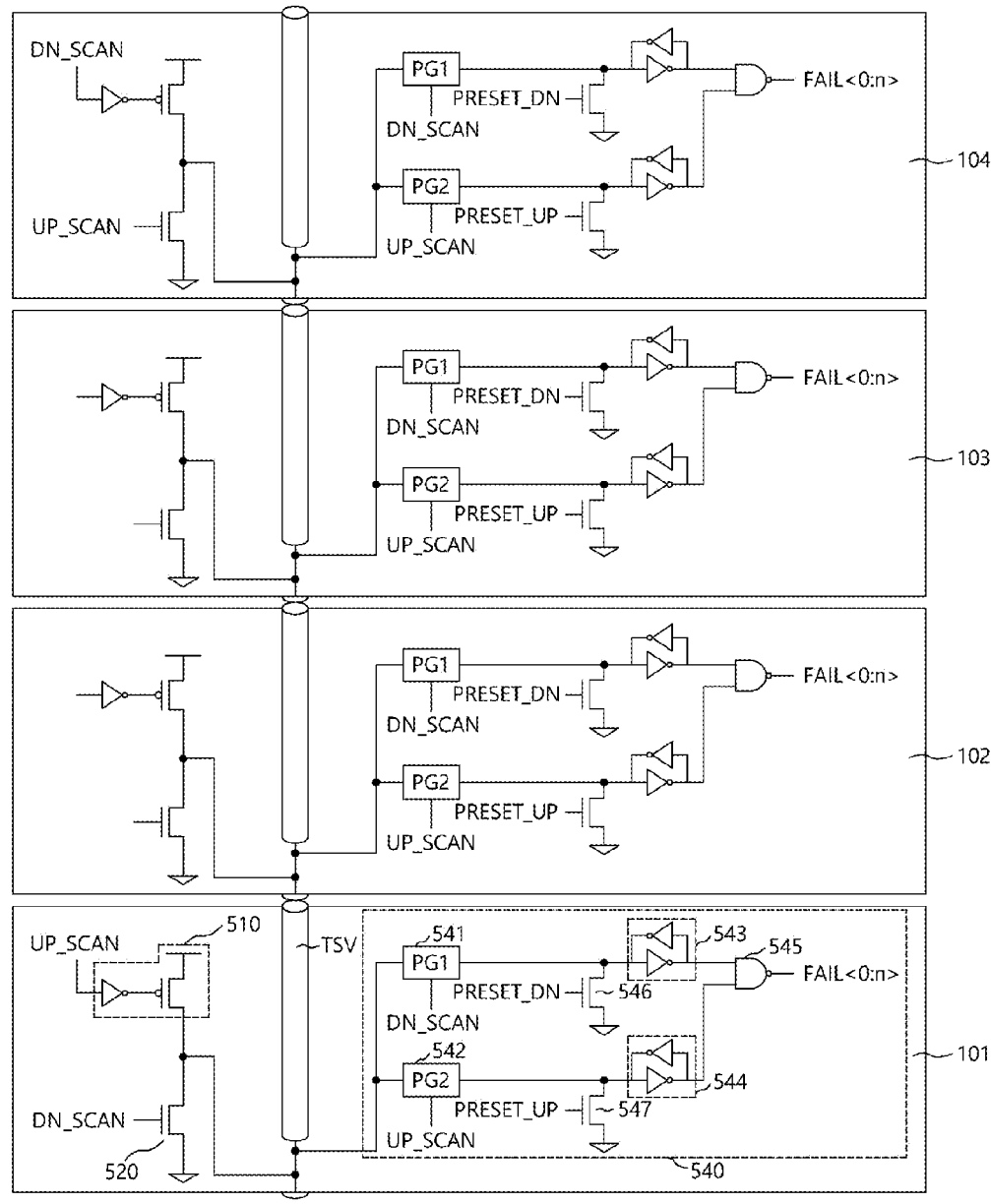
FIG. 12 is a view illustrating a representation of an example of a configuration of a through-hole via scanning circuit of FIG. 9.

Referring to FIG. 12, the through-hole via scanning circuit 501 may be included in each of the stacked semiconductor chips 101 to 104. FIG. 12 illustrates an example of the through-hole via scanning circuits 501 corresponding to through-hole vias which are included in the stacked semiconductor chips 101 to 104 one by one and arranged on the same line in the column direction among the through-hole vias TSV of the stacked semiconductor chips 101 to 104.

The through-hole via scanning circuit 501 may include a current source 510, a current leaker 520, and a failure determination circuit 540.

The current source 510 and the current leaker 520 may have the same configurations as those in the through-hole via scanning circuit 500 of FIG. 5.

The failure determination circuit 540 may initialize a pre-stored down scan result value according to the first preset signal PRESET_DN and newly store the down scan result value according to the down scan signal DN_SCAN.

The failure determination circuit 540 may initialize a pre-stored up scan result value according to the second preset signal PRESET_UP and newly store the up scan result value according to the up scan signal UP_SCAN.

The failure determination circuit 540 may generate the plurality of failure determination signals FAIL<0:n> by combining the newly stored down scan result value and the newly stored up scan result value.

The failure determination result 540 may store voltage levels of the through-hole vias according to the up scan signal UP_SCAN and the down scan signal DN_SCAN as the down scan result value and the up scan result value.

The failure determination circuit 540 may include a first pass gate (PG1) 541, a second pass gate (PG2) 542, a first latch 543, a second latch 544, a logic gate, for example, a NAND gate 545, a first transistor 546, and a second transistor 547.

The first pass gate 541 may store an input signal, that is, a voltage level of the through-hole via TSV in the first latch 543 when the down scan signal DN_SCAN is a high level.

The second pass gate 542 may store an input signal, that is, a voltage level of the through-hole via TSV in the second latch 544 when the up scan signal UP_SCAN is a high level.

The NAND gate 545 may output a corresponding failure determination signal of a low level among the failure determination signals FAIL<0:n> when both the signal levels stored in the first latch 543 and the second latch 544 are a high level, and output the corresponding failure determination signal of a high level among the failure determination signals FAIL<0:n> when any one of the signal levels stored in the first and second latches 543 and 544 is a low level.

The first transistor 546 may initialize the pre-stored down scan result value, that is, the signal level pre-stored in the first latch 543 to a high level when the first preset signal PRESET_DN is a high level.

The second transistor 547 may initialize the pre-stored up scan result value, that is, the signal level pre-stored in the second latch 544 to a high level when the second preset signal PRESET_UP is a high level.

Since both the signal level stored in the first latch 543 and the signal level stored in the second latch 544 are the high level, the corresponding failure determination signal among the failure determination signals FAIL<0:n> may be initialized to the low level.

The down scan signal DN_SCAN may be input to the current source 510 of the uppermost semiconductor chip 104 among the stacked semiconductor chips 101 to 104, and the up scan signal UP_SCAN may be input to the current leaker 520 of the uppermost semiconductor chip 104.

The up scan signal UP_SCAN may be input to the current source 510 of the lowermost semiconductor chip 101 among the stacked semiconductor chips 101 to 104 and the down scan signal DN_SCAN may be input to the current leaker 520 of the lowermost semiconductor chip 101.

Input terminals of the current sources 510 and the current leakers 520 of other semiconductor chips 102 and 103 other than the uppermost semiconductor chip 104 and the lowermost semiconductor chip 101, that is, input terminals of inverters and gates of NMOS transistors in the other semiconductor chips 102 and 103 may be floating.

Stacking information according to stacked positions of the semiconductor chips 101 to 104 may be stored in each of the stacked semiconductor chips 101 to 104.

The stacking information may be information which defines a staked position of a corresponding semiconductor chip, that is, an uppermost position, a lowermost position, or a middle position.

According to the stack type semiconductor apparatus according to an embodiment, the through-hole via scanning circuit 501 may selectively input the down scan signal DN_SCAN and the up scan signal UP_SCAN to the current source 510 and the current leaker 520 or allow the current source 510 and the current leaker 520 to be floating, according to the stacked position of a corresponding semiconductor chip among the stacked semiconductor chips using the stacking information as illustrated in FIG. 12.

The through-hole via failure detection operation according to an embodiment will be described with reference to FIGS. 11 and 12.

An abnormal signal related to the scan operation before a boot-up operation may be generated due to several reasons after the power-up of the semiconductor apparatus.

Then, the boot-up operation may be performed and the boot-up count signal BU_CNT may be activated according to the boot-up operation.

The scan start signal SCAN_START may be activated at a preset timing after pulses of the boot-up count signal BU_CNT may be generated, and the first preset signal PRESET_DN, and the down scan signal DN_SCAN, the second preset signal PRESET_UP, and the up scan signal UP_SCAN may be sequentially activated according to the scan start signal SCAN_START.

The pre-stored down scan result value may be initialized to the high level according to the first preset signal PRESET_DN.

As the down scan signal DN_SCAN is activated, current may flow from the current source 510 of the uppermost semiconductor chop 104 to the current leaker 520 of the lowermost semiconductor chip 101 through through-hole vias TSV.

Since the up scan signal UP_SCAN is inactivated during the activation period of the down scan signal DN_SCAN, the current leaker 520 of the uppermost semiconductor chip 104 and the current source 510 of the lowermost semiconductor chip 101 may be inactivated.

As the down scan signal DN_SCAN is activated, the failure determination circuit 540 in each of the stacked semiconductor chips 101 to 104 may newly store a voltage level according to the current flowing through a through-hole via TSV coupled to the corresponding failure determination circuit 540 as the down scan result value.

The pre-stored up scan result value may be initialized to the high level according to the second preset signal PRESET_UP.

Subsequently, as the up scan signal UP_SCAN is activated, current may flow from the current source 510 of the lowermost semiconductor chip 101 to the current leaker 520 of the uppermost semiconductor chip 104 through the through-hole vias TSV.

Since the down scan signal DN_SCAN is inactivated during the activation period of the up scan signal UP_SCAN, the current leaker 520 of the lowermost semiconductor chip 101 and the current source 510 of the uppermost semiconductor chip 104 may be inactivated.

As the up scan signal UP_SCAN is activated, the failure determination circuit 540 in each of the stacked semiconductor chips 101 to 104 may newly store a voltage level according to the current flowing through the through-hole via TSV coupled to the corresponding failure determination circuit 540 as the up scan result value.

When both the newly stored down scan result value and the newly stored up scan result value are a high level which defines a normal state of the corresponding through-hole via TSV, the failure determination circuit 540 in each of the stacked semiconductor chips 101 to 104 may output a corresponding failure determination signal of a low level among the failure determination signals FAIL<0:n>.

When any one of the newly stored down scan result value and the newly stored up scan result value is a low level which defines a failure of the corresponding through-hole via TSV, the failure determination circuit may output the corresponding failure determination signal of a high level among the failure determination signals FAIL<0:n>.

Figure 13:
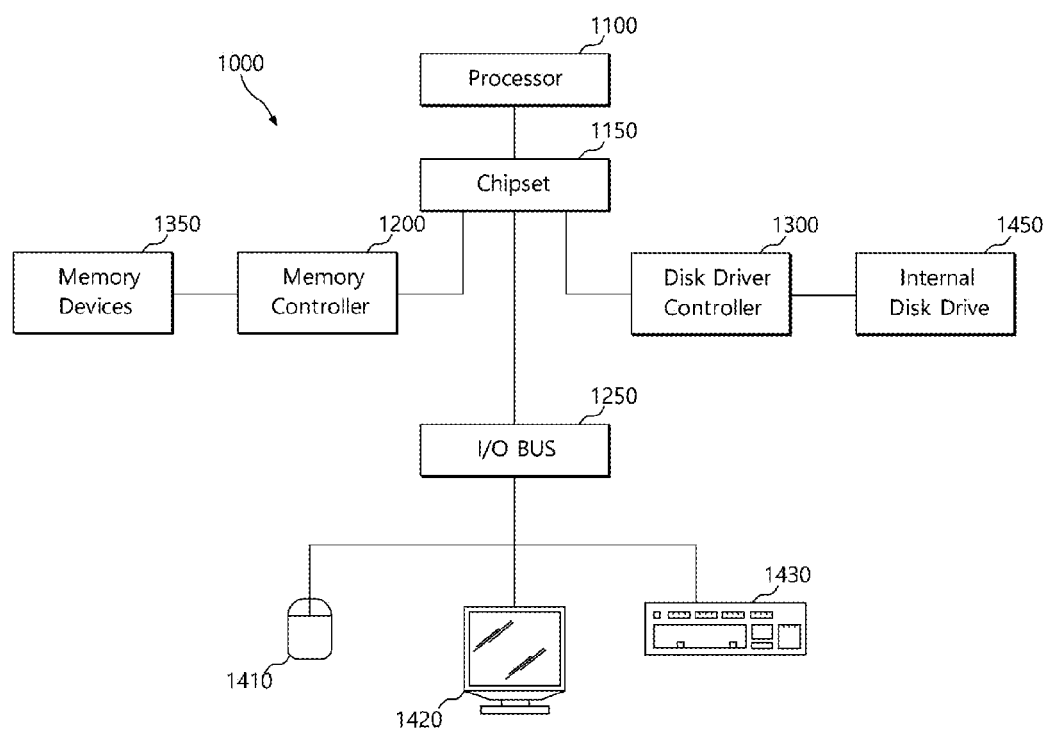
FIG. 13 illustrates a block diagram of an example of a representation of a system employing a stack type semiconductor apparatus with the various embodiments discussed above with relation to FIGS. 1-12.

The stack type semiconductor apparatuses as discussed above (see FIGS. 1-12) are particular useful in the design of memory devices, processors, and computer systems. For example, referring to FIG. 13, a block diagram of a system employing a stack type semiconductor apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one stack type semiconductor apparatus as discussed above with reference to FIGS. 1-12. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one stack type semiconductor apparatus as discussed above with relation to FIGS. 1-12, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 13 is merely one example of a system 1000 employing a stack type semiconductor apparatus as discussed above with relation to FIGS. 1-12. In alternate embodiments, such as, for example but not limited to, cellular phones or digital cameras, the components may differ from the embodiments illustrated in FIG. 13.

The above embodiments of the description are illustrative and not limitative. Various alternatives and equivalents are possible. The description is not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A stack type semiconductor apparatus comprising:
a plurality of semiconductor chips stacked and configured for transferring signals through through-hole vias,
wherein each of the plurality of stacked semiconductor chips includes an error detection circuit configured to perform a down scan for transferring a signal to a lower direction and an up scan for transferring a signal to an upper direction through through-hole vias in a column direction among the through-hole vias, and to determine whether the through-hole vias have failed according to a down scan result value and an up scan result value.

2. The stack type semiconductor apparatus of claim 1, wherein the error detection circuit is configured to perform the down scan by allowing current to flow to the lower direction through the through-hole vias in the column direction and perform the up scan by allowing current to flow to the upper direction through the through-hole vias in the column direction.

3. The stack type semiconductor apparatus of claim 1, wherein the error detection circuit includes:
a scan control signal generating circuit configured to generate scan control signals according to a source signal; and
a through-hole via scanning circuit configured to generate failure determination signals which define a failure or non-failure of the through-hole vias by performing the down scan and the up scan according to the scan control signals.

4. The stack type semiconductor apparatus of claim 3, wherein each of the plurality of semiconductor chips further includes an array fuse circuit configured to store information of a memory cell determined to be a failure, and
the error detection circuit uses a signal used in a boot-up operation of the array fuse circuit as the source signal.

5. The stack type semiconductor apparatus of claim 3, wherein the scan control signal generating circuit is configured to generate a plurality of shift signals by sequentially shifting the source signal according to a clock signal, and generate the scan control signals by combining the plurality of shift signals in preset circuits.

6. The stack type semiconductor apparatus of claim 3, wherein the through-hole via scanning circuit includes:
a current source configured to allow current to flow from a power terminal to a through-hole via among the through-hole vias according to a down scan signal or an up scan signal;
a current leaker configured to allow current to flow from the through-hole via to a ground terminal according to the up scan signal or the down scan signal; and
a failure determination circuit configured to generate a failure determination signal corresponding to the through-hole via according to voltage levels of the through-hole via according to the up scan signal and the down scan signal.

7. The stack type semiconductor apparatus of claim 6, wherein the failure determination circuit is configured to store the down scan result value according to the down scan signal and a latch signal, store the up scan result value according to the up scan signal and the latch signal, and generate the failure determination signal by combining the down scan result value and the up scan result value.

8. The stack type semiconductor apparatus of claim 6, wherein each of the plurality of semiconductor chips is configured to store stacking information which defines its corresponding stacked position relative to other semiconductor chips within the plurality of semiconductor chips stacked, and the through-hole via scanning circuit is configured to selectively provide the up scan signal or the down scan signal to the current source according to the stacking information.

9. The stack type semiconductor apparatus of claim 6, wherein each of the plurality of semiconductor chips is configured to store stacking information which defines its own stacked position, and the through-hole via scanning circuit is configured to allow current sources of other semiconductor chips other than an uppermost semiconductor chip and a lowermost semiconductor chip among the plurality of semiconductor chips to be floating according to the stacking information.

10. The stack type semiconductor apparatus of claim 1, wherein the error detection circuit is configured to perform the down scan by allowing current to flow to a through-hole via of a lowermost semiconductor chip among the semiconductor chips through a through-hole via of an uppermost semiconductor chip and perform the up scan by allowing current to flow to the through-hole via of the uppermost semiconductor chip from the through-hole via of the lowermost semiconductor chip.

11. A stack type semiconductor apparatus comprising:
a plurality of semiconductor chips stacked and configured for transferring signals through through-hole vias,
wherein each of the plurality of semiconductor chips includes:
an error detection circuit configured to perform a down scan by allowing current to flow through a through-hole via of a lowermost semiconductor chip among the plurality of semiconductor chips through a through-hole via of an uppermost semiconductor chip, to perform an up scan by allowing current to flow through the through-hole via of the uppermost semiconductor chip from the through-hole via of the lowermost semiconductor chip, and to determine whether the through-hole vias have failed according to a down scan result value and an up scan result value; and
a repair circuit configured to switch an input and output (I/O) path coupled to a through-hole via determined to be a failure through the error detection circuit to an I/O path coupled to a normal through-hole via.

12. The stack type semiconductor apparatus of claim 11, wherein the error detection circuit includes:
a scan control signal generating circuit configured to generate scan control signals according to a source signal; and
a through-hole via scanning circuit configured to generate failure determination signals which define a failure or non-failure of the through-hole vias by performing the down scan and the up scan according to the scan control signals.

13. The stack type semiconductor apparatus of claim 12, wherein each of the plurality of semiconductor chips further includes an array fuse circuit configured to store information of a memory cell determined to be a failure, and
the error detection circuit uses a signal used in a boot-up operation of the array fuse circuit as the source signal.

14. The stack type semiconductor apparatus of claim 12, wherein the scan control signal generating circuit is configured to generate a plurality of shift signals by sequentially shifting the source signal according to a clock signal, and generate the scan control signals by combining the plurality of shift signals in preset circuits.

15. The stack type semiconductor apparatus of claim 12, wherein the through-hole via scanning circuit includes:
a current source configured to allow current to flow from a power terminal to a through-hole via among the through-hole vias according to a down scan signal or an up scan signal;
a current leaker configured to allow current to flow from the through-hole via to a ground terminal according to the up scan signal or the down scan signal; and
a failure determination circuit configured to generate a failure determination signal corresponding to the through-hole via according to voltage levels of the through-hole via according to the up scan signal and the down scan signal.

16. The stack type semiconductor apparatus of claim 15, wherein the failure determination circuit is configured to store the down scan result value according to the down scan signal and a latch signal, store the up scan result value according to the up scan signal and the latch signal, and generate the failure determination signal by combining the down scan result value and the up scan result value.

17. The stack type semiconductor apparatus of claim 15, wherein each of the plurality of semiconductor chips is configured to store stacking information which defines its corresponding stacked position relative to other semiconductor chips within the plurality of semiconductor chips stacked, and the through-hole via scanning circuit is configured to selectively provide the up scan signal or the down scan signal to the current source according to the stacking information.

18. The stack type semiconductor apparatus of claim 15, wherein each of the plurality of semiconductor chips is configured to store stacking information which defines its own stacked position, and the through-hole via scanning circuit is configured to allow current sources of other semiconductor chips other than an uppermost semiconductor chip and a lowermost semiconductor chip among the plurality of semiconductor chips to be floating according to the stacking information.

19. The stack type semiconductor apparatus of claim 11, wherein the repair circuit includes:
a first input driver configured to drive a signal transferred through a first line or a second line among first signal I/O lines to a first through-hole via among the through-hole vias according to a failure determination signal; and
a first output driver configured to drive a signal transferred through the first through-hole via or a second through-hole via to the first line according to the failure determination signal.

20. A stack type semiconductor apparatus comprising:
a plurality of semiconductor chips stacked and configured for transferring signals through through-hole vias,
wherein each of the plurality of stacked semiconductor chips includes an error detection circuit configured to initialize a pre-stored down scan result value according to a first preset signal and perform a down scan for transferring a signal to a lower direction through through-hole vias in a column direction among the through-hole vias, to initialize a pre-stored up scan result value according to a second preset signal and perform an up scan for transferring a signal to an upper direction through the through-hole vias in the column direction, and to determine whether the through-hole vias have failed according to a down scan result value and an up scan result value.

21. The stack type semiconductor apparatus of claim 20, wherein the error detection circuit includes:
a scan control signal generating circuit configured to generate the preset signal, a down scan signal, the second preset signal, and an up scan signal according to a boot-up count signal; and
a through-hole via scanning circuit configured to perform the down scan and the up scan according to the first preset signal, the down scan signal, the second preset signal, and the up scan signal, and generate failure determination signals which define a failure or non-failure of the through-hole vias according to the down scan result value and the up scan result value.

22. The stack type semiconductor apparatus of claim 21, wherein each of the plurality of semiconductor chips further includes an array fuse circuit configured to store information for a memory cell determined to be a failure, and
the boot-up count signal is used in a boot-up operation of the array fuse circuit.

23. The stack type semiconductor apparatus of claim 21, wherein the scan control signal generating circuit includes:
a flip-flop array configured to generate the first preset signal, the down scan signal, the second preset signal, and the up scan signal by sequentially shifting a scan start signal according to the boot-up count signal; and
a counter configured to generate the scan start signal according to the boot-up count signal.

24. The stack type semiconductor apparatus of claim 21, wherein the through-hole via scanning circuit includes:
a current source configured to allow current to flow from a power terminal to a through-hole via among the through-hole vias according to the down scan signal or the up scan signal;
a current leaker configured to allow current to flow from the through-hole via to a ground terminal according to the up scan signal or the down scan signal; and
a failure determination circuit configured to generate a failure determination signal corresponding to the through-hole via according to voltage levels of the through-hole via according to the up scan signal and the down scan signal.

25. The stack type semiconductor apparatus of claim 24, wherein the failure determination circuit is configured to initialize the pre-stored down scan result value according to the first preset signal and newly store the down scan result value according to the down scan signal, to initialize the pre-stored up scan result value according to the second preset value and newly store the up scan result value according to the up scan signal, and to generate the failure determination signal by combining the down scan result value and the up scan result value.

26. The stack type semiconductor apparatus of claim 24, wherein each of the plurality of semiconductor chips is configured to store stacking information which defines its corresponding stacked position relative to other semiconductor chips within the plurality of semiconductor chips stacked, and the through-hole via scanning circuit is configured to selectively provide the up scan signal or the down scan signal to the current source according to the stacking information.

27. The stack type semiconductor apparatus of claim 24, wherein each of the plurality of semiconductor chips is configured to store stacking information which defines its own stacked position, and the through-hole via scanning circuit is configured to allow current sources of other semiconductor chips other than an uppermost semiconductor chip and a lowermost semiconductor chip among the plurality of semiconductor chips to be floating according to the stacking information.

\* \* \* \* \*